US012603248B2

(12) United States Patent
Iwasa et al.

(10) Patent No.: US 12,603,248 B2
(45) Date of Patent: Apr. 14, 2026

(54) PLASMA PROCESSING APPARATUS

(71) Applicant: Tokyo Electron Limited, Tokyo (JP)

(72) Inventors: Torai Iwasa, Kurokawagun (JP);
Takehiro Tanikawa, Kurokawagun
(JP); Masaya Herai, Kurokawagun
(JP); Kazuki Oshima, Kurokawagun
(JP); Yuzuru Sakai, Kurokawagun (JP)

(73) Assignee: Tokyo Electron Limited, Tokyo (JP)

( * ) Notice: Subject to any disclaimer, the term of this
patent is extended or adjusted under 35
U.S.C. 154(b) by 271 days.

(21) Appl. No.: 18/351,172

(22) Filed: Jul. 12, 2023

(65) Prior Publication Data

US 2024/0030003 A1    Jan. 25, 2024

(30) Foreign Application Priority Data

Jul. 20, 2022    (JP) ................................. 2022-115711

(51) Int. Cl.
*H01J 37/32*    (2006.01)
(52) U.S. Cl.
CPC .. *H01J 37/32174* (2013.01); *H01J 37/32568*
(2013.01); *H01J 37/32091* (2013.01); *H01J
2237/334* (2013.01)
(58) Field of Classification Search
None
See application file for complete search history.

(56) References Cited

U.S. PATENT DOCUMENTS

| | | | |
|---|---|---|---|
| 8,268,184 B2 * | 9/2012 | Ko | H01J 37/321 |
| | | | 257/E29.345 |
| 8,501,630 B2 * | 8/2013 | Metz | H01L 21/76897 |
| | | | 216/72 |
| 11,205,561 B2 * | 12/2021 | Kubota | H01J 37/32165 |
| 12,087,591 B2 * | 9/2024 | Tamamushi | H01J 37/3007 |
| 2007/0284246 A1 * | 12/2007 | Keil | H01J 37/3299 |
| | | | 204/298.36 |
| 2011/0022215 A1 * | 1/2011 | Keil | H01J 37/3299 |
| | | | 700/110 |
| 2012/0077347 A1 * | 3/2012 | Metz | H01J 37/32082 |
| | | | 438/723 |

(Continued)

FOREIGN PATENT DOCUMENTS

JP        2015-005755 A        1/2015

*Primary Examiner* — Srinivas Sathiraju
(74) *Attorney, Agent, or Firm* — PROCOPIO, CORY,
HARGREAVES & SAVITCH LLP

(57) ABSTRACT

A plasma processing apparatus includes a plasma processing
chamber, a substrate support disposed in the plasma pro-
cessing chamber and including a lower electrode, an upper
electrode disposed above the substrate support, a first RF
signal generator coupled to the lower electrode and config-
ured to generate a first RF signal, the first RF signal having
a first power level during a first state in a repetition period,
a second power level less than the first power level during
a second state in the repetition period, and the second power
level during a third state in the repetition period, and a
second RF signal generator coupled to the lower electrode
and configured to generate a second RF signal, the second
RF signal having a third power level during the first state, a
fourth power level greater than the third power level during
the second state, and the third power level.

20 Claims, 11 Drawing Sheets

(56) References Cited

U.S. PATENT DOCUMENTS

| | | | | |
|---|---|---|---|---|
| 2012/0129354 A1* | 5/2012 | Luong | ............... | H01J 37/32082 |
| | | | | 438/714 |
| 2012/0267048 A1* | 10/2012 | Moyama | ........... | H01J 37/32229 |
| | | | | 156/345.33 |
| 2013/0008607 A1* | 1/2013 | Matsumoto | ....... | H01J 37/32238 |
| | | | | 343/770 |
| 2013/0213573 A1* | 8/2013 | Valcore, Jr. | ............... | H02J 3/00 |
| | | | | 156/345.44 |
| 2014/0312767 A1* | 10/2014 | Tian | .................. | H01J 37/32238 |
| | | | | 315/39 |
| 2015/0017811 A1* | 1/2015 | Inoue | ................. | H01L 21/3065 |
| | | | | 438/723 |
| 2015/0075566 A1* | 3/2015 | Tanikawa | ........... | C23C 16/4401 |
| | | | | 29/559 |
| 2017/0250056 A1* | 8/2017 | Boswell | ................. | H02M 1/14 |
| 2019/0333785 A1* | 10/2019 | Tanikawa | ......... | H01L 21/67069 |
| 2019/0355557 A1* | 11/2019 | Moriya | .................. | G01S 17/06 |

| | | | | |
|---|---|---|---|---|
| 2020/0266036 A1* | 8/2020 | Aoki | ................. | H01J 37/32146 |
| 2020/0373130 A1* | 11/2020 | Tanikawa | .......... | H01J 37/32082 |
| 2020/0402775 A1* | 12/2020 | Hayasaka | ......... | H01J 37/32651 |
| 2021/0233745 A1* | 7/2021 | Koshimizu | ....... | H01J 37/32183 |
| 2021/0358715 A1* | 11/2021 | Thomas | ........... | H01J 37/32146 |
| 2021/0358717 A1* | 11/2021 | Kim | .................... | H01J 37/3211 |
| 2022/0084787 A1* | 3/2022 | Koshimizu | ....... | H01J 37/32174 |
| 2022/0084788 A1* | 3/2022 | Takeuchi | .......... | H01J 37/32146 |
| 2022/0084800 A1* | 3/2022 | Tanikawa | .......... | H01J 37/32183 |
| 2022/0223427 A1* | 7/2022 | Tamamushi | ........ | H01L 21/6831 |
| 2022/0384150 A1* | 12/2022 | Koshimizu | ....... | H01J 37/32541 |
| 2023/0060329 A1* | 3/2023 | Tanikawa | .......... | H01J 37/32642 |
| 2023/0124201 A1* | 4/2023 | Shoeb | ................ | H01L 21/6833 |
| | | | | 438/798 |
| 2023/0170194 A1* | 6/2023 | Guo | .................. | H01J 37/32715 |
| | | | | 438/711 |
| 2023/0307215 A1* | 9/2023 | Matsudo | ................. | H01L 21/31 |
| 2023/0335379 A1* | 10/2023 | Shindo | ............... | H01L 21/3065 |
| 2024/0030003 A1* | 1/2024 | Iwasa | ............... | H01J 37/32568 |

* cited by examiner

PLASMA PROCESSING APPARATUS

CROSS-REFERENCE TO RELATED APPLICATION

The present application claims priority under 35 U.S.C. § 119 to Japanese Patent Application No. 2022-115711 filed on Jul. 20, 2022, the entire contents of which are incorporated herein by reference.

BACKGROUND

Field

An exemplary embodiment of this disclosure relates to a plasma processing apparatus.

Description of Related Art

JP2015-005755A discloses a technique for effectively preventing deposition on an internal member of a chamber such as the inner wall of the chamber or an insulator in the plasma processing apparatus.

SUMMARY

In one exemplary embodiment of this disclosure, there is provided a plasma processing apparatus including: a plasma processing chamber; a substrate support disposed in the plasma processing chamber and including a lower electrode; an upper electrode disposed above the substrate support; a first RF signal generator coupled to the lower electrode and configured to generate a first RF signal, the first RF signal having a first power level during a first state in a repetition period, a second power level less than the first power level during a second state in the repetition period, and the second power level during a third state in the repetition period; a second RF signal generator coupled to the lower electrode and configured to generate a second RF signal, the second RF signal having a third power level during the first state, a fourth power level greater than the third power level during the second state, and the third power level during the third state; and a DC signal generator coupled to the upper electrode and configured to generate a DC signal, the DC signal having a first voltage level during the first state and a second voltage level during the second state, an absolute value of the first voltage level being greater than an absolute value of the second voltage level.

DETAILED DESCRIPTION

Figure 1:
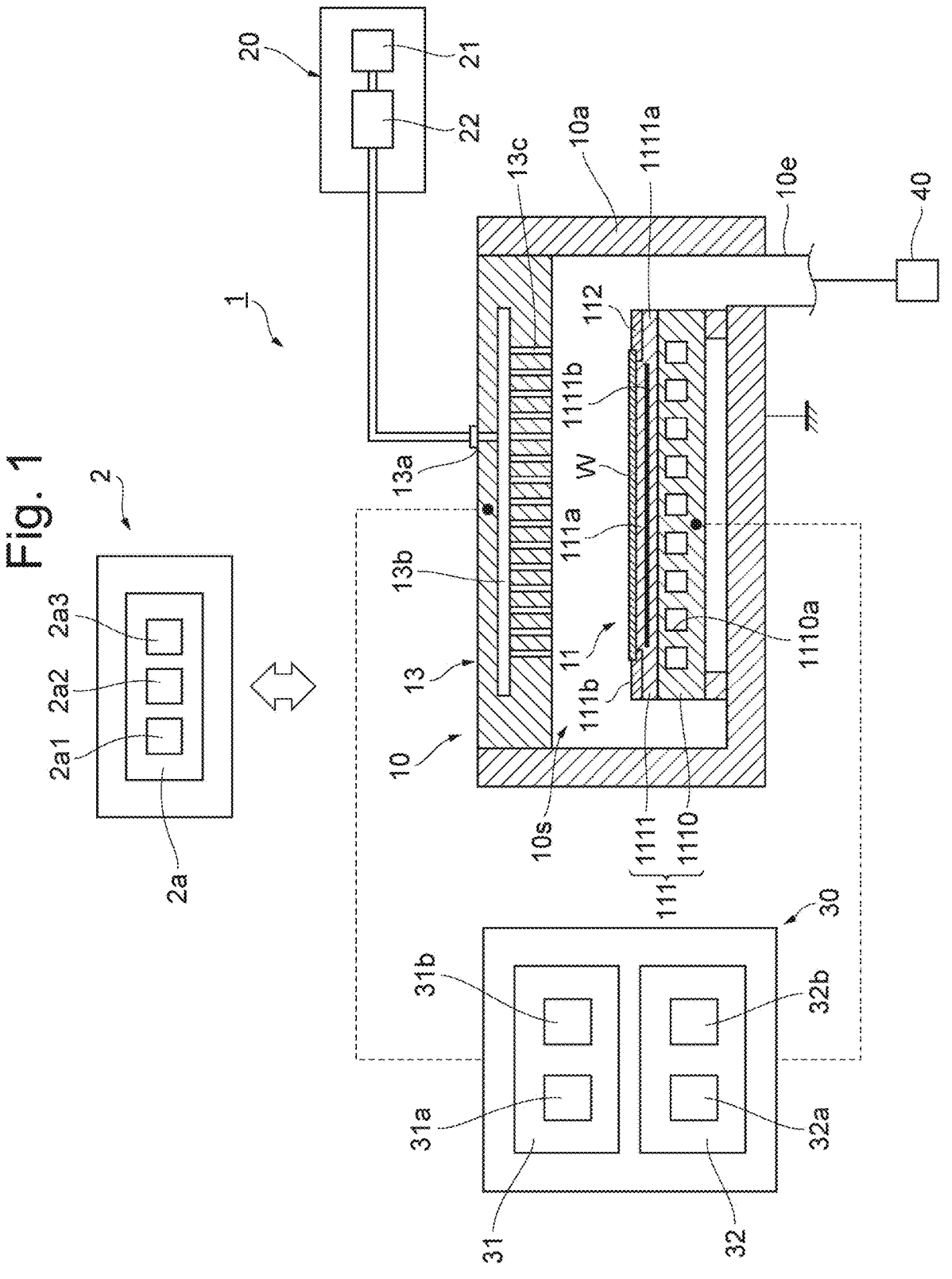
FIG. 1 is a diagram for describing a configuration example of a capacitive coupling type plasma processing apparatus.

Each embodiment of this disclosure will be described below.

In one exemplary embodiment, there is provided a plasma processing apparatus including: a plasma processing chamber; a substrate support disposed in the plasma processing chamber and including a lower electrode; an upper electrode disposed above the substrate support; a first RF signal generator coupled to the lower electrode and configured to generate a first RF signal, the first RF signal having a first power level during a first state in a repetition period; a second power level less than the first power level during a second state in the repetition period, and the second power level during a third state in the repetition period; a second RF signal generator coupled to the lower electrode and configured to generate a second RF signal, the second RF signal having a third power level during the first state, a fourth power level greater than the third power level during the second state, and the third power level during the third state; and a DC signal generator coupled to the upper electrode and configured to generate a DC signal, the DC signal having a first voltage level during the first state and a second voltage level during the second state, an absolute value of the first voltage level being greater than an absolute value of the second voltage level.

In one exemplary embodiment, the first voltage level has a negative polarity.

In one exemplary embodiment, the DC signal has the first voltage level during the third state.

In one exemplary embodiment, the second power level is zero power level.

In one exemplary embodiment, the third power level is zero power level.

In one exemplary embodiment, the second voltage level is zero voltage level.

In one exemplary embodiment, the frequency of the first RF signal is greater than the frequency of the second RF signal.

In one exemplary embodiment, the repetition period is a period in a range of 20 µs to 800 µs.

In one exemplary embodiment, the first state occupies a period of 10% to 80% of the repetition period.

In one exemplary embodiment, the second state occupies a period of 10% to 80% of the repetition period.

In one exemplary embodiment, the third state occupies a period of 10% to 80% of the repetition period.

In one exemplary embodiment, the first voltage level is in a range of −500 V to −2500 V.

In one exemplary embodiment, there is provided a plasma processing apparatus including: a plasma processing chamber; a substrate support disposed in the plasma processing chamber and including a lower electrode; an upper electrode disposed above the substrate support; an RF signal generator coupled to the lower electrode and configured to generate an RF signal, the RF signal having a first power level during a first state in a repetition period, a second power level less than the first power level during a second state in the repetition period, and the second power level during a third state in the repetition period; a first DC signal generator coupled to the lower electrode and configured to generate a first DC signal, the first DC signal having a first voltage level during the first state, a sequence of voltage pulses having a second voltage level during the second state, and the first voltage level during the third state, an absolute value of the first voltage level being less than an absolute value of the second voltage level; and a second DC signal generator coupled to the upper electrode and configured to generate a second DC signal, the second DC signal having a third voltage level during the first state, and a fourth voltage level during the second state, an absolute value of the third voltage level being greater than an absolute value of the fourth voltage level.

In one exemplary embodiment, the second voltage level has a negative polarity.

In one exemplary embodiment, the sequence of voltage pulses has a pulse frequency in a range of 100 kHz to 500 kHz.

In one exemplary embodiment, the first voltage level is zero voltage level.

In one exemplary embodiment, the second voltage level is in a range of –5 kV to –30 kV.

In one exemplary embodiment, the third voltage level has a negative polarity.

In one exemplary embodiment, wherein the second DC signal has the third voltage level during the third state.

In one exemplary embodiment, the fourth voltage level is zero voltage level.

Each embodiment of this disclosure will be described in detail below with reference to the accompanying drawings. Note that the same or similar elements in respective drawings are given the same reference numerals to omit redundant description. The positional relationship such as up, down, left, and right will be described based on the positional relationship illustrated in each drawing unless otherwise noted. The dimension ratio of the drawing is not intended to represent an actual ratio, and the actual ratio is not limited to the illustrated ratio.

<Configuration Example of Plasma Processing Apparatus>

FIG. 1 is a diagram for describing a configuration example of a capacitive coupling type plasma processing apparatus.

A capacitive coupling type plasma processing apparatus 1 includes a controller 2, a plasma processing chamber 10, a gas supply 20, a power supply 30, and an exhaust system 40. Further, the plasma processing apparatus 1 includes a substrate support 11 and a gas introduction section. The gas introduction section is configured to introduce at least one process gas into the plasma processing chamber 10. The gas introduction section includes a showerhead 13. The substrate support 11 is disposed in the plasma processing chamber 10. The showerhead 13 is disposed above the substrate support 11. In one embodiment, the showerhead 13 constitutes at least part of a ceiling of the plasma processing chamber 10. The plasma processing chamber 10 has a plasma processing space defined by the showerhead 13, side walls 10a of the plasma processing chamber and the substrate support 11. The plasma processing chamber 10 has at least one gas supply port for supplying at least one process gas into the plasma processing space 10s, and at least one gas exhaust port for exhausting the gas from the plasma processing space. The plasma processing chamber 10 is grounded. The showerhead 13 and the substrate support 11 are electrically insulated from the casing of the plasma processing chamber 10.

The substrate support 11 includes a main body 111 and a ring assembly 112. The main body 111 has a central region 111a for supporting a substrate W, and an annular region 111b for supporting the ring assembly 112. A wafer is an example of the substrate W. The annular region 111b of the main body 111 surrounds the central region 111a of the main body 111 in plan view. The substrate W is disposed on the central region 111a of the main body 111, and the ring assembly 112 is disposed on the annular region 111b of the main body 111 in a manner to surround the substrate W on the central region 111a of the main body 111. Therefore, the central region 111a is also called a substrate support surface for supporting the substrate W, and the annular region 111b is also called a ring support surface for supporting the ring assembly 112.

In one embodiment, the main body 111 includes a base 1110 and an electrostatic chuck 1111. The base 1110 includes a conductive member. The conductive member of the base 1110 can function as a lower electrode. The electrostatic chuck 1111 is disposed on the base 1110. The electrostatic chuck 1111 includes a ceramic member 1111a and an electrostatic electrode 1111b disposed in the ceramic member 1111a. The ceramic member 1111a has the central region 111a. In one embodiment, the ceramic member 1111a also has the annular region 111b. Note that any other member that surrounds the electrostatic chuck 1111 such as an annular electrostatic chuck or an annular insulating member may have the annular region 111b. In this case, the ring assembly 112 may be disposed on the annular electrostatic chuck or the annular insulating member, or disposed on both the electrostatic chuck 1111 and the annular insulating member. Further, at least one RF/DC electrode coupled to an RF (Radio Frequency) power supply 31 and/or a DC (Direct Current) power supply 32 to be described later may be disposed in the ceramic member 1111a. In this case, at least one RF/DC electrode functions as the lower electrode. When a bias RF signal and/or a DC signal is supplied to at least one RF/DC electrode to be described later, the RF/DC electrode is also called a bias electrode. Note that the conductive member of the base 1110 and at least one RF/DC electrode may also function as two or more lower electrodes. Further, the electrostatic electrode 1111b may function as the lower electrode. Therefore, the substrate support 11 includes at least one lower electrode.

The ring assembly 112 includes one or more annular members. In one embodiment, the one or more annular members include one or more edge rings and at least one covering. Each edge ring is formed from a conductive material or an insulating material, and the covering is formed from an insulating material.

Further, the substrate support 11 may include a temperature control module configured to adjust the temperature of at least one of the electrostatic chuck 1111, the ring assembly 112, and the substrate to a target temperature. The temperature control module may include a heater, a heat transfer medium, or flow paths 1110a, or a combination thereof. A heat transfer fluid such as brine or gas flows in the flow paths 1110a. In one embodiment, the flow paths 1110a are formed in the base 1110, and one or more heaters are disposed in the ceramic member 1111a of the electrostatic chuck 1111. Further, the substrate support 11 may include a heat transfer gas supply configured to supply a heat transfer gas into a gap between the back surface of the substrate W and the central region 111a.

The showerhead 13 is configured to introduce at least one process gas from the gas supply 20 into the plasma processing space 10s. The showerhead 13 has at least one gas supply port 13a, at least one gas diffusion chamber 13b, and plural gas introduction ports 13c. The process gas supplied to the gas supply port 13a passes through the gas diffusion chamber 13b, and is introduced from the plural gas introduction ports 13c into the plasma processing space 10s. Further, the showerhead 13 includes at least one upper electrode. Note that the gas introduction section may also include one or more side gas injectors (SGIs) attached to one or more openings formed through the side walls 10a in addition to the showerhead 13.

The gas supply 20 may also include at least one gas source 21 and at least one flow controller 22. In one embodiment, the gas supply 20 is configured to supply at least one process gas from each corresponding gas source 21 to the showerhead 13 through each corresponding flow controller 22. For example, each flow controller 22 may also include a mass flow controller or a pressure control type flow controller. Further, the gas supply 20 may include one or more flow modulation devices for modulating or pulsing the flow rate of at least one process gas.

The power supply 30 includes the RF power supply 31 coupled to the plasma processing chamber 10 through at least one impedance matching circuit.

The RF power supply 31 is configured to supply at least one RF signal (RF power) to at least one lower electrode. Thus, a plasma is formed from at least one process gas supplied to the plasma processing space 10s. Therefore, the RF power supply 31 can function as part of a plasma generator configured to generate the plasma from one or more process gases in the plasma processing chamber 10. Further, a bias potential is generated in the substrate W by supplying the bias RF signal to at least one lower electrode so that ion components in the formed plasma can be attracted to the substrate W.

In one embodiment, the RF power supply 31 includes a first RF generator 31a and a second RF generator 31b. The first RF generator 31a is configured to be coupled to at least one lower electrode through at least one impedance matching circuit so as to generate a source RF signal for plasma generation. In one embodiment, the source RF signal has a frequency in a range of 10 MHz to 150 MHz. In one embodiment, the first RF generator 31a may also be configured to generate plural source RF signals having different frequencies. The generated one or more source RF signals are supplied to at least one lower electrode. In one embodiment, the generated one or more source RF signals are supplied to at least one lower electrode.

The second RF generator 31b is configured to be coupled to at least one lower electrode through at least one impedance matching circuit so as to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency in a range of 100 kHz to 60 MHz. In one embodiment, the second RF generator 31b may also be configured to generate plural bias RF signals having different frequencies. The generated one or more bias RF signals are supplied to at least one lower electrode. Further, in various embodiments, at least one of the source RF signal and the bias RF signal may be pulsed.

Further, the power supply 30 may include the DC power supply 32 coupled to the plasma processing chamber 10. The DC power supply 32 includes a first DC generator 32a and a second DC generator 32b. In one embodiment, the first DC generator 32a is configured to be connected to at least one lower electrode so as to generate a first DC signal (hereinafter also called a "bias DC signal"). The generated bias DC signal is applied to at least one lower electrode. In one embodiment, the second DC generator 32b is configured to be connected to at least one upper electrode so as to generate a second DC signal (hereinafter also called an "upper DC signal"). The generated upper DC signal is applied to at least one upper electrode. In one embodiment, any one or more of the following effects (I) to (V) can be obtained by supplying the upper DC signal to the upper electrode: (I) the spatter effect on the surface of the upper electrode is increased by increasing a self-bias voltage of the upper electrode; (II) the plasma is shrunk by expanding a plasma sheath in the upper electrode; (III) electrons generated in the upper electrode are irradiated on the substrate W; (IV) plasma potential is controlled; and (V) the plasma electron density is increased.

In various embodiments, at least one of the first and second DC signals may be pulsed. In this case, a sequence of voltage pulses is applied to at least one lower electrode and/or at least one upper electrode. The voltage pulses may have a rectangular, trapezoidal, or triangular waveform, or a combination of these pulse waveforms. In one embodiment, a waveform generator for generating a sequence of voltage pulses from the DC signal is connected between the first DC generator 32a and at least one lower electrode. Therefore, the first DC generator 32a and the waveform generator constitute a voltage pulse generator. On the other hand, when the second DC generator 32b and the waveform generator constitute the voltage pulse generator, the voltage pulse generator is connected to at least one upper electrode. The voltage pulses may have a positive polarity or a negative polarity. Further, the sequence of voltage pulses may include one or more positive voltage pulses and one or more negative voltage pulses in one cycle. Note that the first and second DC generators 32a and 32b may also be provided in addition to the RF power supply 31, or the first DC generator 32a may be provided instead of the second RF generator 31b. In one embodiment, the power supply 30 may be composed of the RF power supply 31 including the first RF generator 31a and the second RF generator 31b, and the DC power supply 32 including the second DC generator 32b. In one embodiment, the power supply 30 may be composed of the RF power supply 31 including the first RF generator 31a, and the DC power supply 32 including the first DC generator 32a and the second DC generator 32b.

The exhaust system 40 can be connected, for example, to a gas exhaust port 10e provided at the bottom of the plasma processing chamber 10. The exhaust system 40 may also include a pressure regulating valve and a vacuum pump. Pressure in the plasma processing space 10s is regulated by the pressure regulating valve. The vacuum pump may include a turbomolecular pump or a dry pump, or a combination these pumps.

The controller 2 processes computer executable instructions that cause the plasma processing apparatus 1 to execute various processes to be described in this disclosure. The controller 2 can be configured to control each of elements of the plasma processing apparatus 1 in order to execute various processes to be described here. In one embodiment, some or all of components of the controller 2 may be included in the plasma processing apparatus 1. The controller 2 may include a processor 2a1, a storage 2a2, and a communication interface 2a3. The controller 2 is, for example, realized by a computer 2a. The processor 2a1 can be configured to read a program from the storage 2a2, and execute the read program in order to perform various control actions. This program may be prestored in the storage 2a2, or may be acquired through a medium when required. The acquired program is stored in the storage 2a2, read by the processor 2a1 from the storage 2a2, and executed by the processor 2a1. The medium may be any of various storage media readable on the computer 2a, or may be a communication line connected to the communication interface 2a3. The processor 2a1 may be a CPU (Central Processing Unit). The storage 2a2 may include a RAM (Random Access Memory), a ROM (Read Only Memory), an HDD (Hard Disk Drive), an SSD (Solid State Drive), or a combination of these storage media. The communication interface 2a3 may communicate with the plasma processing apparatus 1 through a communication line such as LAN (Local Area Network).

<Example of Plasma Processing Method>

The plasma processing apparatus 1 according to one exemplary embodiment executes a plasma processing method for plasm processing of a substrate (hereinafter also called the "present processing method"). The plasma processing can be various processing using a plasma including an etching process, a film-forming process, a trimming process, a cleaning process, and the like.

Figure 2:
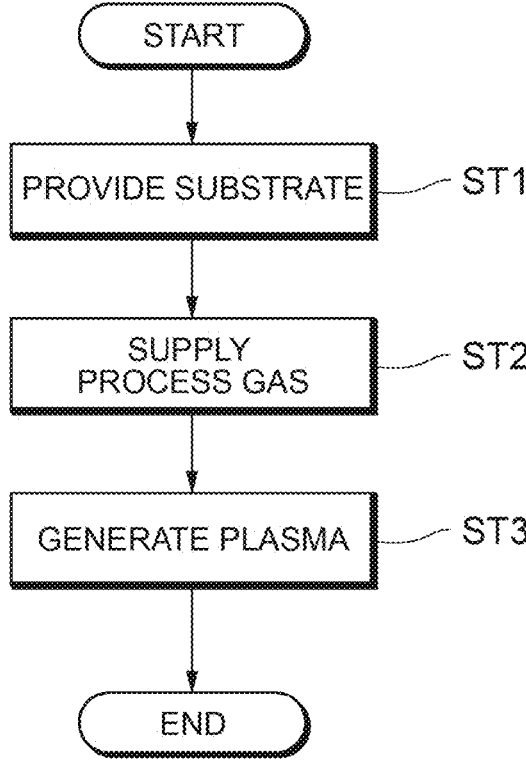
FIG. 2 is a flowchart illustrating an example of a processing method.

FIG. 2 is a flowchart illustrating an example of the present processing method. FIG. 2 illustrates an example of a method of etching the substrate. As illustrated in FIG. 2, the present processing method may include a process (ST1) of providing the substrate, a process (ST2) of supplying a process gas, and a process (ST3) of generating a plasma. In one embodiment, the controller 2 controls each component of the plasma processing apparatus 1 to execute the present processing method.

In process ST1, the substrate W is provided in the plasma processing space 10s of the plasma processing apparatus 1. The substrate W is carried into the chamber 10 by a transfer arm, and disposed in the central region 111a of the substrate support 11. The substrate W is held by suction on the substrate support 11 by the electrostatic chuck 1111 (see FIG. 1).

Figure 3:
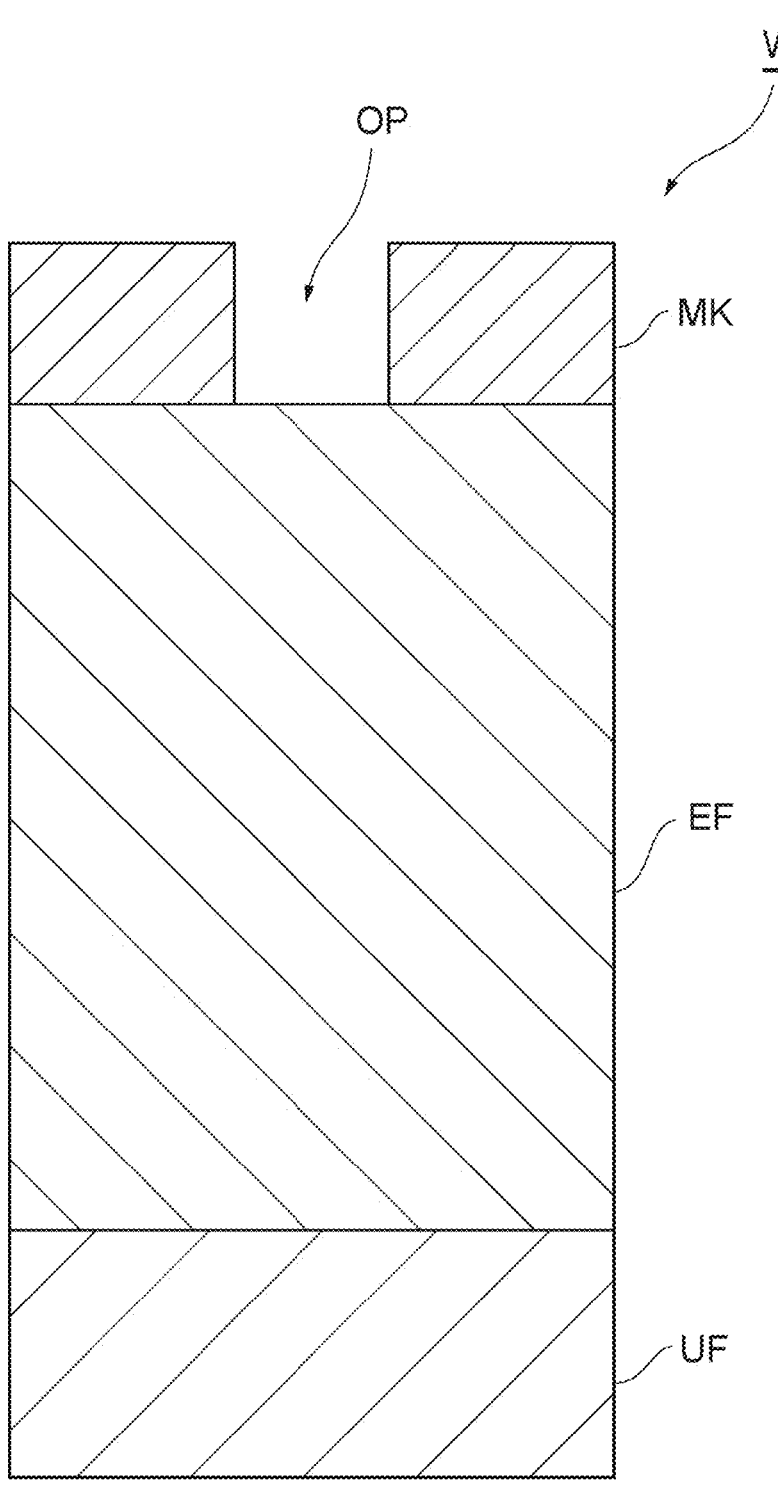
FIG. 3 is a diagram illustrating an example of the cross-sectional structure of a substrate W provided in process ST1.

FIG. 3 is a diagram illustrating an example of the cross-sectional structure of the substrate W provided in process ST1. The substrate W is so structured that an etching target film EF and a mask MK are stacked on an underlying film UF in this order. The substrate W may also be used in the manufacture of semiconductor devices. For example, the semiconductor devices include semiconductor devices such as a DRAM and a 3D-NAND flash memory.

As an example, the underlying film UF is a silicon wafer, or an organic film, a dielectric film, a metal film, a semiconductor film or the like formed on the silicon wafer. The underlying film UF may also be constructed by stacking plural films.

The etching target film EF is a film different from the underlying film UF. For example, the etching target film EF may be an organic film, a dielectric film, a semiconductor film, or a metal film. The etching target film EF may be constructed by one film or by stacking plural films. For example, the etching target film EF may be constructed by stacking one or more films such as a silicon-containing film, a carbon-containing film, a spin-on-grass (SOG) film, and an Si-containing anti-reflective coating (SiARC) film. In one embodiment, the etching target film is a silicon-containing film. In an example, the silicon-containing film is constructed by alternately stacking silicon oxide films and silicon nitride films. In another example, the silicon-containing film is constructed by alternately stacking silicon oxide films and polycrystal silicon films. In still another example, the silicon-containing film is a film stack containing a silicon nitride film, a silicon oxide film, and a polycrystal silicon film. In yet another example, the silicon-containing film contains a silicon carbonitride film.

The mask MK is formed from a material lower in etching rate for the plasma generated in process ST3 than the etching target film EF. The mask MK may be a single layer mask composed of one layer, or may be a multilayer mask composed of two or more layers. As illustrated in FIG. 3, the mask MK defines at least one opening OP on the mask MK. The opening OP is a space on the mask MK and is surrounded by side walls of the mask MK. In other words, the top surface of the etching target film EF has an area covered with the mask MK and an area exposed at the bottom of the opening OP.

The opening OP may have any shape in a plan view of the substrate W, that is, when the substrate W is viewed from top to bottom in FIG. 3. The shape may be a circular, oval, rectangular, or liner shape, or a shape that combines one or more these shapes. The mask MK may have plural side walls, and the plural side walls may define plural openings OP, respectively. The plural openings OP may have linear shapes, respectively, and line up at regular intervals to configure a line and space pattern. Further, the plural openings OP may have hole shapes, respectively, to configure an array pattern.

In process ST2, the process gas is supplied by the gas supply 20 to the showerhead 13, and supplied from the showerhead 13 to the plasma processing space 10s. The process gas contains a gas for generating active species required for the etching process of the substrate W. The type of process gas may be selected as appropriate based on the material of the etching target film, the material of the mask, the material of the underlying film, the mask pattern, the etching depth, and the like.

In process ST3, a plasma is generated from the process gas. In process ST3, the source RF signal and the bias signal are supplied to the lower electrode, and the second DC signal (upper DC signal) is supplied to the upper electrode. In one embodiment, the bias signal is the bias RF signal generated by the second RF generator 31b. In another embodiment, the bias signal is the first DC signal (bias DC signal) generated by the first DC generator 32a. Thus, the plasma is generated from the process gas in the plasma processing space 10s. Further, a bias potential is generated between the plasma and the substrate W. Then, active species such as ions and radicals in the plasma are attracted to the substrate W, and hence the etching target film EF is etched.

Figure 4:
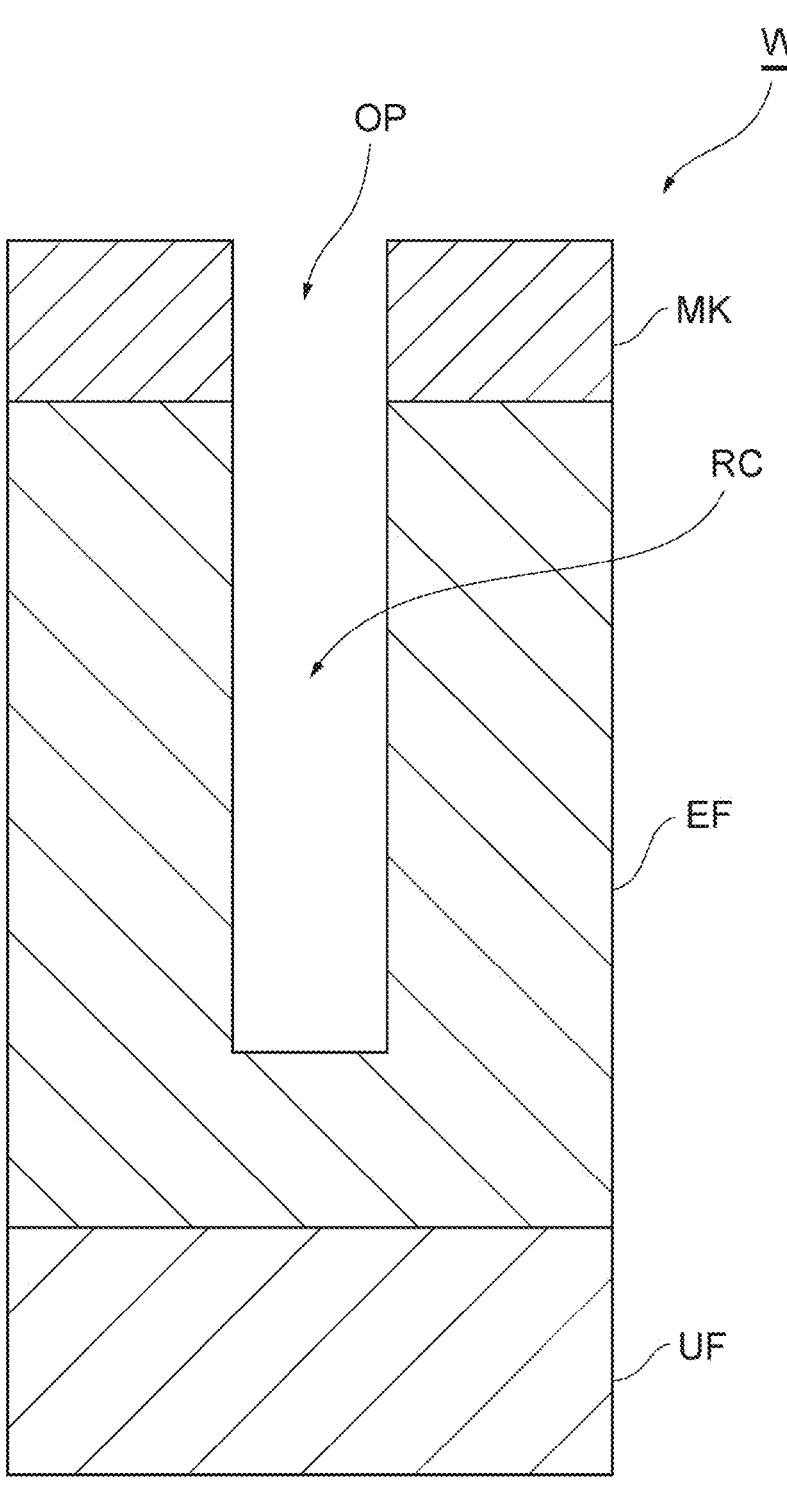
FIG. 4 is a diagram illustrating an example of the cross-sectional structure of the substrate W being processed in process ST3.

FIG. 4 is a diagram illustrating an example of the cross-sectional structure of the substrate W being processed in process ST3. As illustrated in FIG. 4, a part of the etching target film EF uncovered with the mask MK (a part exposed in the opening OP) is etched in the depth direction by the progress of etching. Thus, a recess RC is formed in the etching target film EF based on the shape of the opening OP of the mask MK. Then, when a given stopping condition is met, the supply of the source RF signal, the bias signals, and the upper DC signal is stopped, and process ST3 is ended. The stopping condition may be, for example, the etching time, or may be the depth of the recess RC. The aspect ratio of the recess RC at the end of etching may be, for example, 20 or more, 30 or more, 40 or more, 50 or more, or 100 or more.

In one embodiment, the source RF signal, the bias signal, and the upper DC signal (hereinafter also called "respective signals" together) are pulsed, respectively, and supplied cyclically in a given repetition period T (hereinafter also called "period T"). In one embodiment, the period T is a period in a range of 20 μs to 800 μs.

Figure 5:
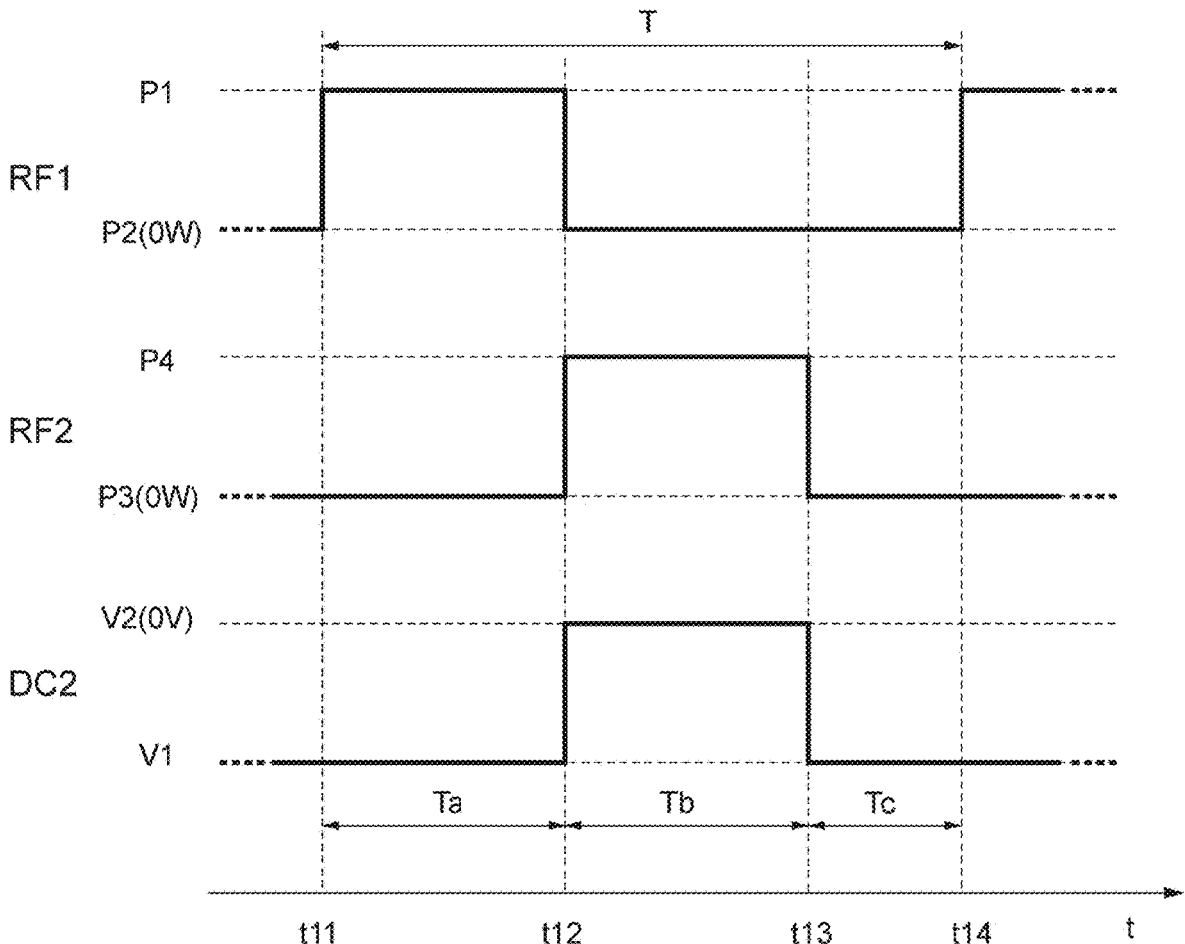
FIG. 5 is a chart illustrating an example of each signal power or voltage in a period T.

FIG. 5 is a chart illustrating an example of each signal power or voltage in the period T. FIG. 5 illustrates an example when the source RF signal (RF1) and the bias RF signal (RF2) are supplied to the lower electrode, and the upper DC signal (DC2) is supplied to the upper electrode. In FIG. 5, the horizontal axis indicates time. Further, the vertical axis indicates powers of the source RF signal (RF1) and the bias RF signal (RF2) (as an example, effective values of the powers), and a voltage of the upper DC signal (DC2) (as an example, an effective value of the voltage).

In the example illustrated in FIG. 5, the period T has a first state Ta (time t11 to time t12), a second state Tb (time t12 to time t13), and a third state Tc (time t13 to time t14) in this order. In one embodiment, the first state Ta occupies a period of 10% to 80% of the period T. In one embodiment, the second state Tb occupies a period of 10% to 80% of the period T. In one embodiment, the third state Tc occupies a period of 10% to 80% of the period T.

In the example illustrated in FIG. 5, the source RF signal (RF1) is pulsed to have a rectangular power pulse waveform in the period T. The source RF signal (RF1) has a first power P1 during the first state Ta, and has a second power P2 lower than the first power P1 during the second state Tb and the third state Tc. In one embodiment, the second power is 0 W.

In the example illustrated in FIG. 5, the bias RF signal (RF2) is pulsed to have a rectangular power pulse waveform in the period T. The bias RF signal (RF2) has a third power P3 during the first state Ta and the third state Tc, and a fourth power P4 greater than the third power P3 during the second state Tb. In one embodiment, the third power is 0 W.

In the example illustrated in FIG. 5, the upper DC signal (DC2) is pulsed to have a rectangular voltage pulse waveform in the period T. The upper DC signal (DC2) has a first negative voltage V1 during the first state Ta and the third state Tc, and a second voltage V2 during the second state Tb. The absolute value of the first voltage V1 is greater than the absolute value of the second voltage V2. In one embodiment, the first voltage V1 is in a range of −500 V to −2500 V. The second voltage V2 may be positive or negative, or may be 0 V. In one embodiment, the second voltage V2 is 0 V.

In the example illustrated in FIG. 5, a state in which source RF signal power level is high (power level P1) and a state in which the bias RF signal power level is high (power level P4) do not overlap during the first state Ta and the second state Tb. In other words, the pulse of the source RF signal and the pulse of the bias RF signal are offset from each other during the first state Ta and the second state Tb. As a result, during the second state Tb in which the bias RF sign power level is high, the absolute value of the power level or voltage level of the source RF signal and the upper DC signal is low, or these signals are not supplied. Therefore, the electron density of the plasma in the second state Tb is reduced to increase the sheath thickness of the plasma. Thus, in the second state Tb, the supply of active species in the plasma to the bottom of the recess RC can be increased.

In one embodiment, when ions in the plasma are attracted to the substrate W to etch the etching target film EF during the first state Ta and the second state Tb, the bottom of the recess RC and the like may be positively charged. In this point, in the example illustrated in FIG. 5, electrification of the substrate W during the third state Tc can be canceled or reduced.

In other words, since the power levels of the source RF signal and the bias RF signal are low or these signals are not supplied during the third state Tc, electrification of the substrate W is suppressed. Further, since the negative upper DC signal is supplied to the upper electrode during the third state Tc, ions in the plasma are attracted to the upper electrode side to emit secondary electrons. The emitted secondary electrons are accelerated by the upper electrode at the negative potential (V1) and reaches the substrate W. The secondary electrons that reached the substrate W can cancel or reduce electrification of positively charged parts (for example, the bottom of the recess RC, and the like) of the substrate W. Thus, the supply of active species in the plasma to the bottom of the recess RC can be increased in the next repetition period T.

Further, in the example illustrated in FIG. 5, the power levels of the source RF signal and the bias RF signal are low or these signals are not supplied during the third state Tc. Therefore, the progress of etching is suppressed during the third state Tc, and the exhaust of by-products produced by the etching can be facilitated. Thus, the supply of active species in the plasma to the bottom of the recess RC can be increased in the next repetition period T.

According to the above, the etching rate of the etching target film EF can be improved in one embodiment. Further, in one embodiment, shape abnormality or shape deterioration due to the etching can be suppressed.

In the meantime, RF power tends to increase in recent years. When RF power increases, the potential of a plasm in the chamber increases. When the potential of the plasm increases, potential differences between the plasma and the upper electrode surface and between the back surface of the upper electrode and a part adjacent to the back surface (as an example, a cooling plate) increase, and an abnormal discharge may occur.

In this regard, as described above, the power levels or the absolute values of the voltage levels of the source RF signal and the upper DC signal are low or these signals are not supplied during the second state Tb in which the power level of the bias RF signal is high in the example illustrated in FIG. 5. Thus, the increase in the potential difference between the plasma and the upper electrode can be suppressed.

Figure 6:
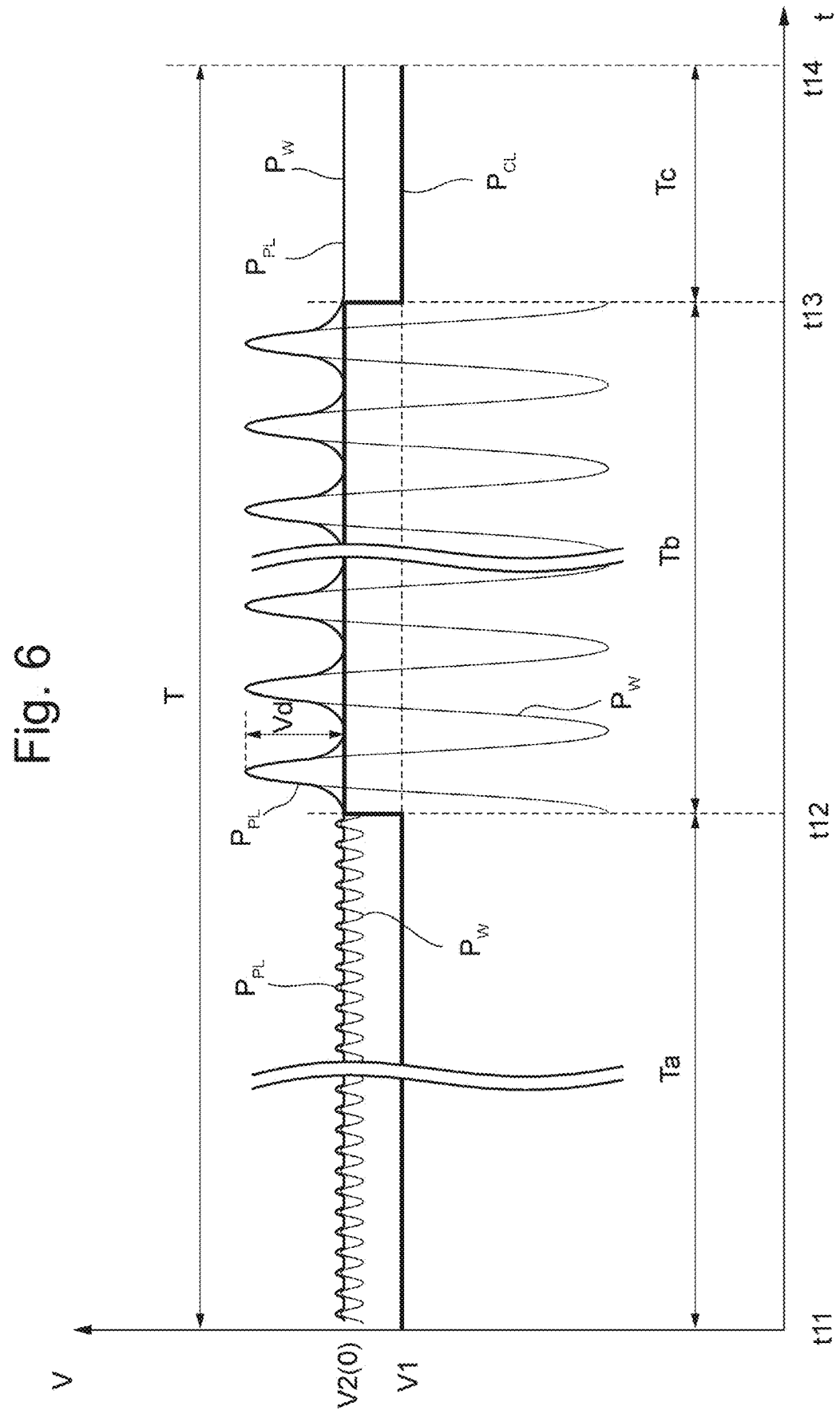
FIG. 6 is a chart for describing a potential difference between a plasma and an upper electrode in the period T of FIG. 5.

FIG. 6 is a chart for describing a potential difference between the plasma and the upper electrode in the period T of FIG. 5. FIG. 6 illustrates an example when the second voltage V2 is 0 V. In FIG. 6, the horizontal axis indicates time, and the vertical axis indicates potential (V). In FIG. 6, PPL indicates plasma potential. Pw indicates the potential of the substrate W. PCL indicates the potential of the upper electrode (as an example, the showerhead 13).

As illustrated in FIG. 6, the potential magnitudes (amplitudes) of the potential PPL of the plasma and the potential Pw of the substrate W are small during the first state Ta and large during the second state Tb. On the other hand, the magnitude of negative potential PCL of the upper electrode is large during the first state Ta and small during the second state Tb (0 V in this example). Therefore, the maximum value (Vd in FIG. 6) of the potential difference between the plasma and the upper electrode during the second state Tb is suppressed from increasing. According to one embodiment, the occurrence of the abnormal discharge described above can be suppressed.

The source RF signal, the bias signal, and the upper DC signal supplied in the period T are not limited to the example illustrated in FIG. 5, and these signals can take various forms.

FIG. 7 to FIG. 11 are charts illustrating other examples of power or voltage of each signal supplied in the period T. In FIG. 7 to FIG. 11, the horizontal axis indicates time. Further, the vertical axis indicates power of the source RF signal (RF1)/bias RF signal (RF2) (as an example, an effective value of the power), and voltage of bias DC signal (DC1)/ upper DC signal (DC2) (as an example, an effective value of the voltage). In the following, description will be made by focusing on differences from the example illustrated in FIG. 5, and description of the same or similar points as or to those in the example illustrated in FIG. 5 will be omitted.

Figure 7:
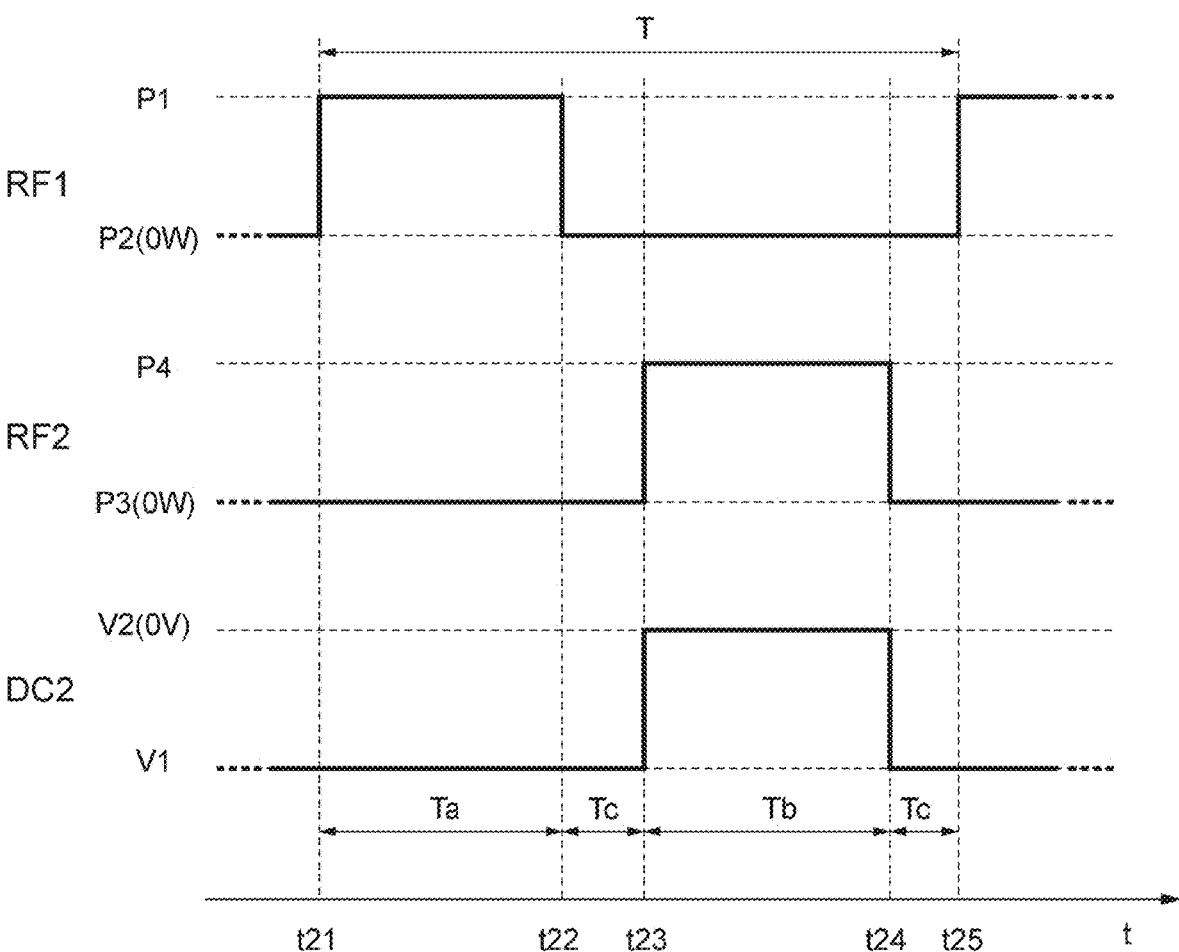
FIG. 7 is a chart illustrating another example of each signal power or voltage in the period T.

In the example illustrated in FIG. 7, the third state Tc is not only provided after the second state Tb (time t24 to time t25), but also provided between the first state Ta and the second state Tb (time t22 to time t23). As illustrated in FIG. 7, the pulse of the bias RF signal may rise at the time (time t23) when a given period has passed from the time (time t22) at which the pulse of the source RF signal fell. In the example illustrated in FIG. 7, the relationship among the respective signals during the first state Ta, the second state Tb, and the third state Tc is the same as that in FIG. 5. Therefore, even in the example illustrated in FIG. 7, the effects of improvement of the etching rate, suppression of shape abnormality and shape deterioration, and suppression of the abnormal discharge can be obtained.

Figure 8:
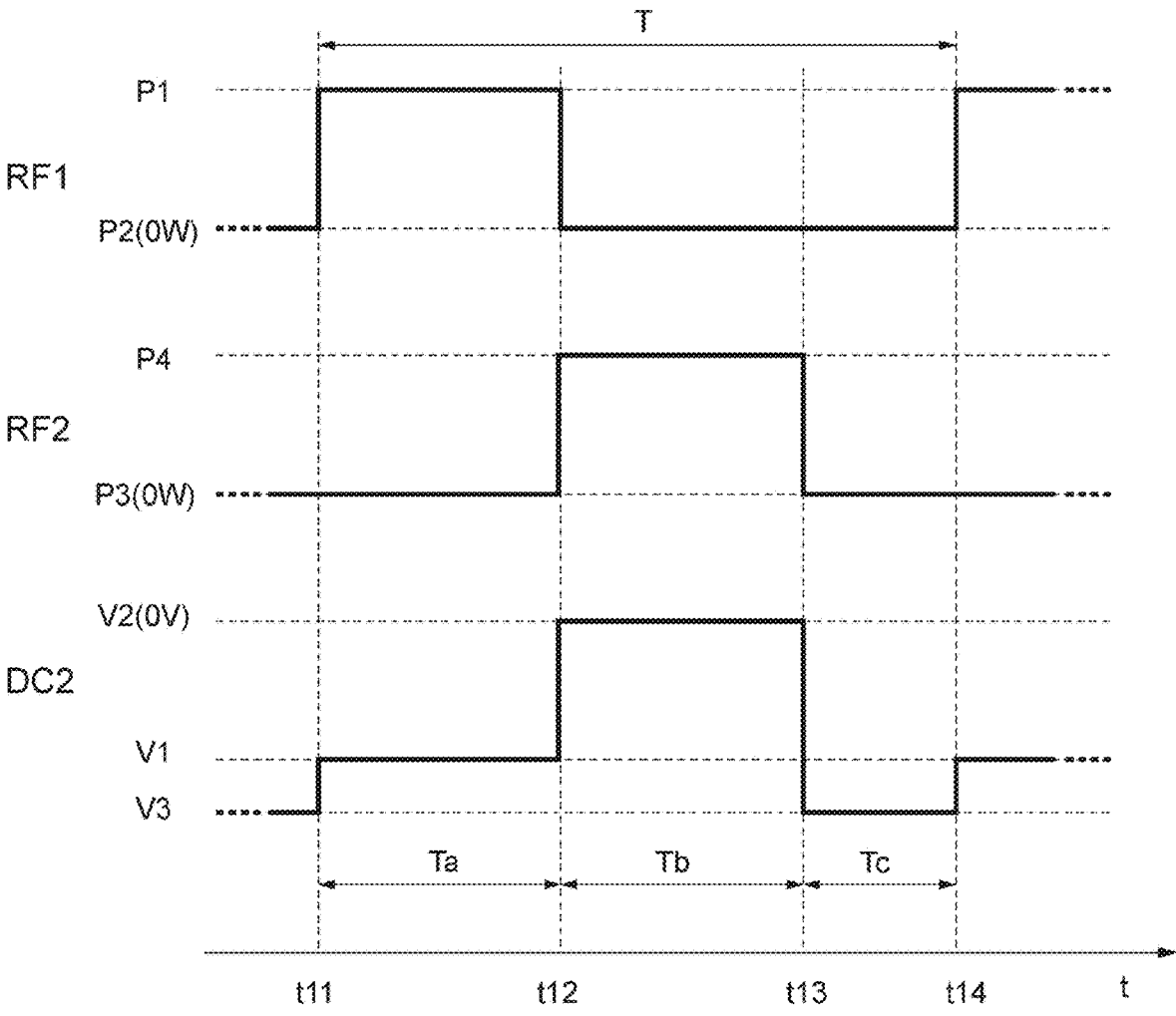
FIG. 8 is a chart illustrating still another example of each signal power or voltage in the period T.

In the example illustrated in FIG. 8, a third negative voltage V3 different from the first voltage V1 is applied as the upper DC signal (DC2) during the third state Tc. As illustrated in FIG. 8, the absolute value of the third voltage V3 may be greater than the absolute value of the first voltage V1. Alternatively, the absolute value of the third voltage V3 may be less than the absolute value of the first voltage V1. In one embodiment, the magnitude of the third voltage V3 may be adjusted appropriately according to the charge amount of the substrate W during the first state Ta and the second state Tb to enhance the canceling or suppressing effect of the electrification. In the example illustrated in FIG. 8, the relationship among the respective signals during the first state Ta, the second state Tb, and the third state Tc is the same as that in the example described in FIG. 5. Therefore, even in the example illustrated in FIG. 8, the effects of improvement of the etching rate, suppression of shape abnormality and shape deterioration, and suppression of the abnormal discharge can be obtained.

Figure 9:
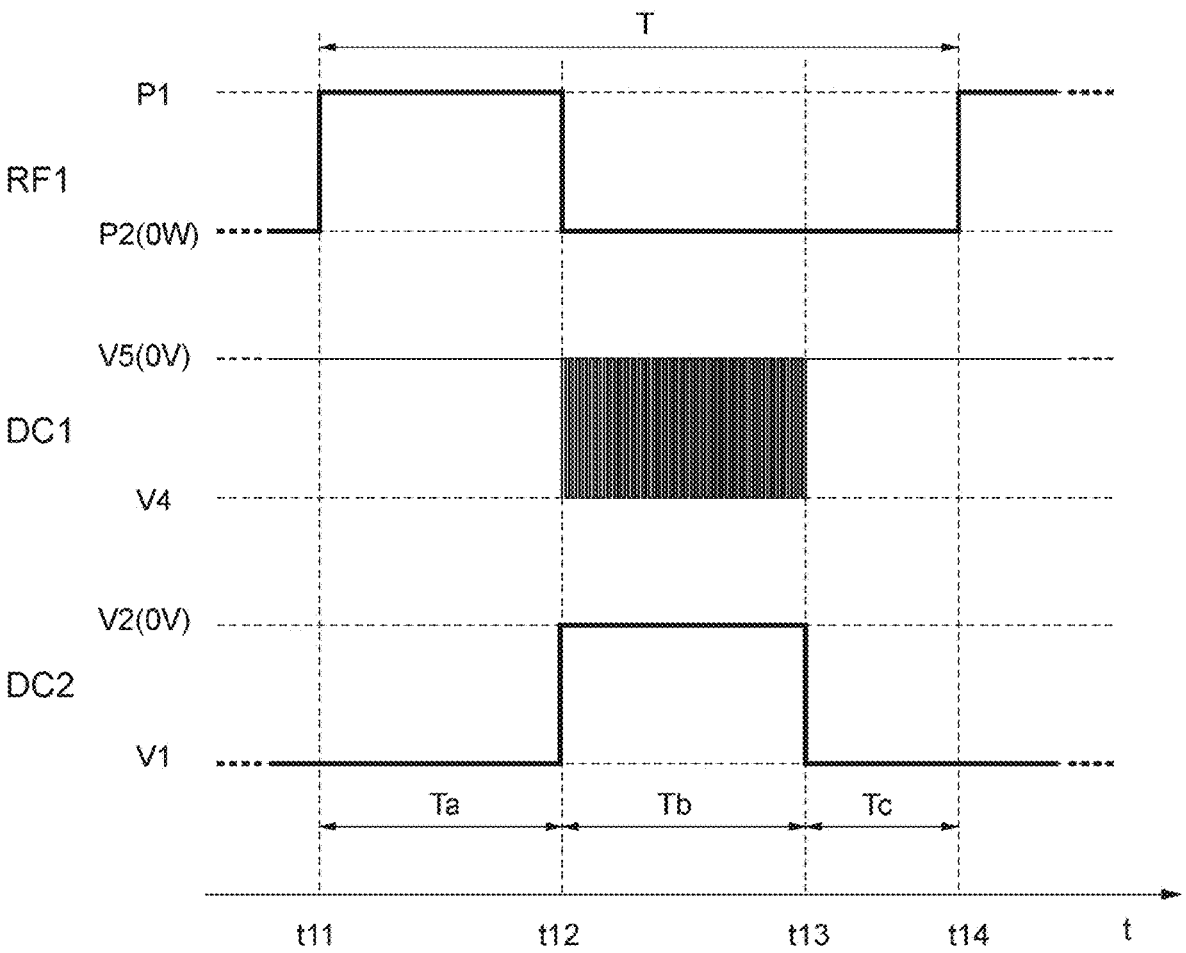
FIG. 9 is a chart illustrating yet another example of each signal power or voltage in the period T.
Figure 10:
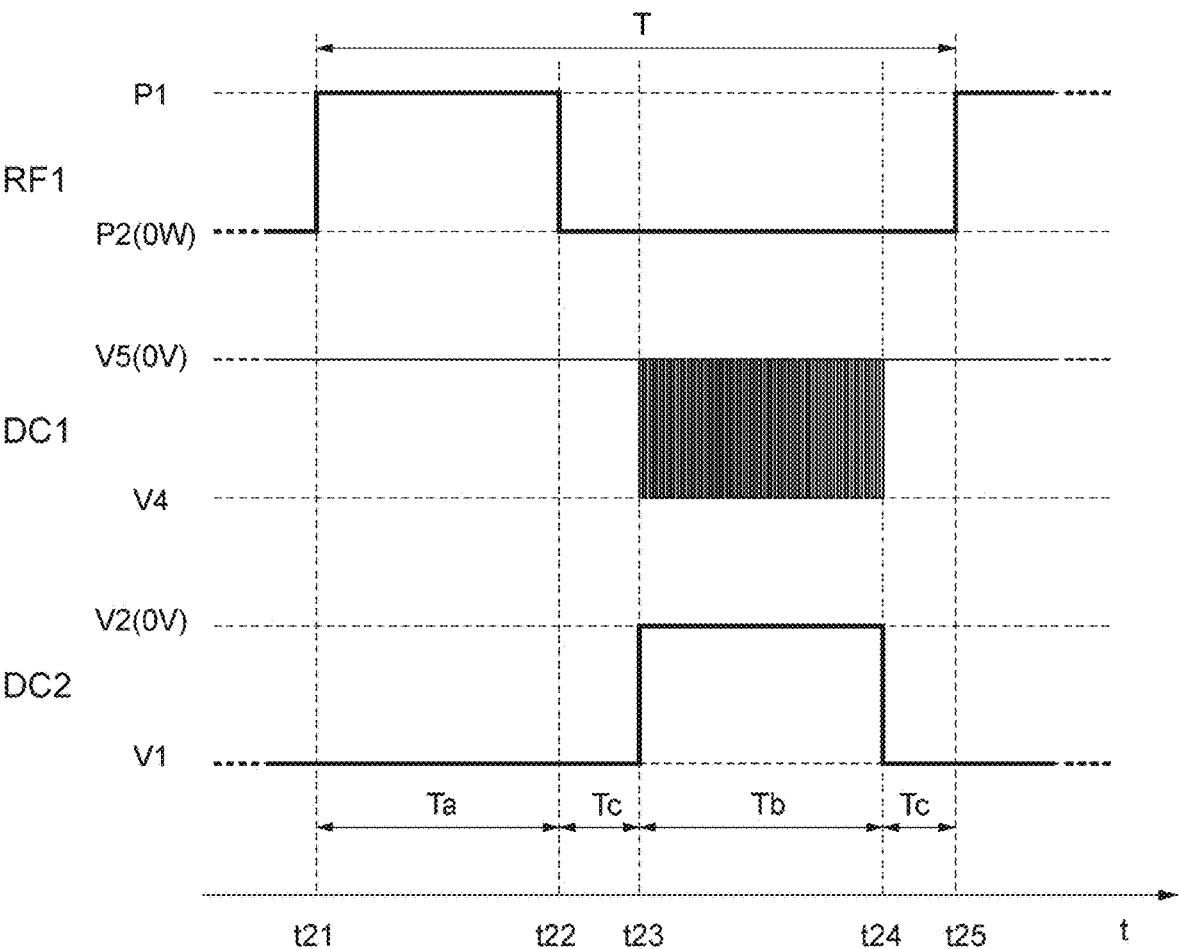
FIG. 10 is a chart illustrating a further example of each signal power or voltage in the period T.
Figure 11:
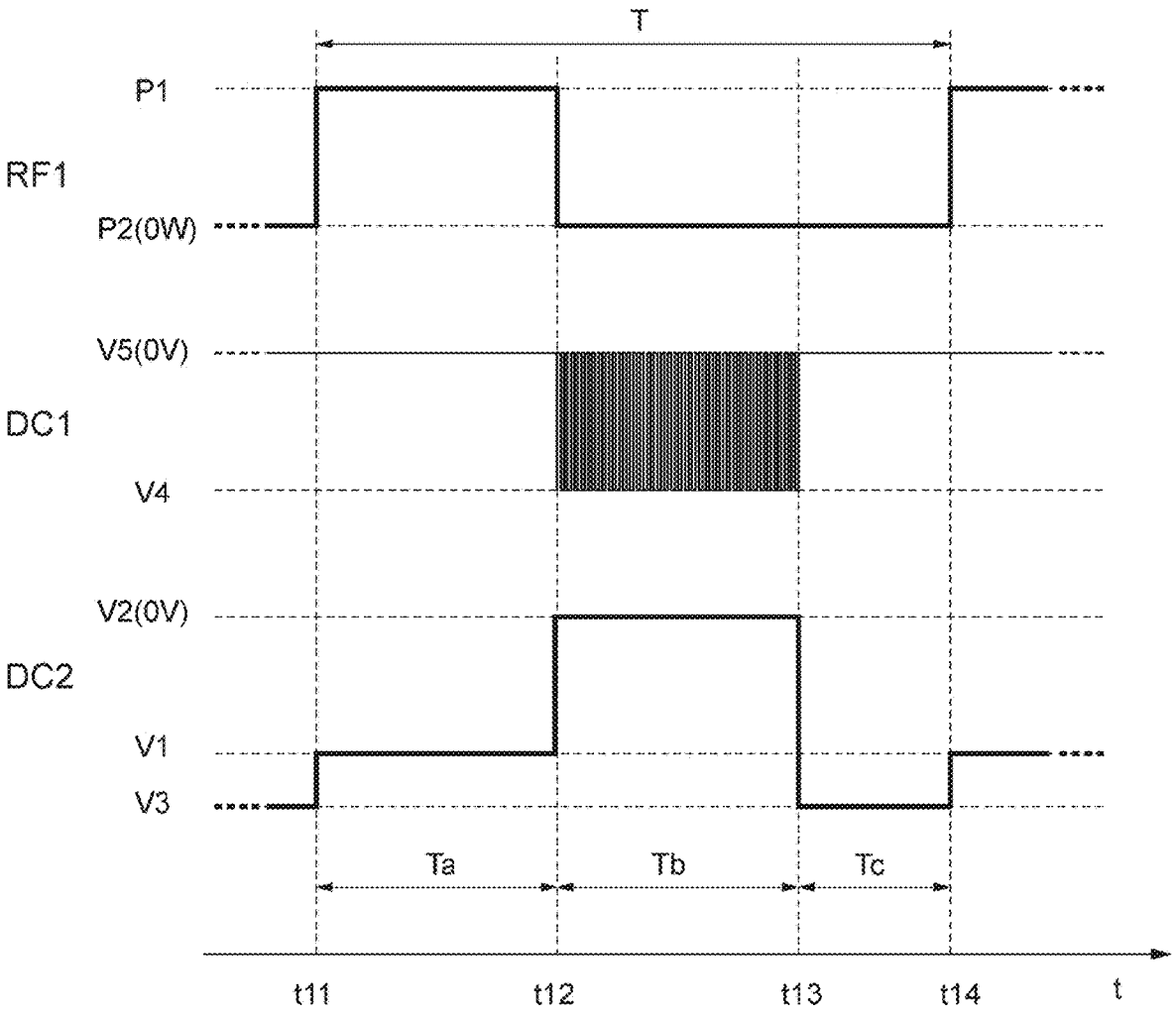
FIG. 11 is a chart illustrating a still further example of each signal power or voltage in the period T.

In the examples illustrated in FIG. 9 to FIG. 11, a bias DC signal (DC1) is used as the bias signal instead of the bias RF signal in the examples illustrated in FIG. 5, FIG. 7, and FIG. 8, respectively. In the examples illustrated in FIG. 9 to FIG. 11, the bias DC signal (DC1) is pulsed to have a rectangular voltage pulse waveform in the period T.

In the examples illustrated in FIG. 9 to FIG. 11, the bias DC signal (DC1) has a sequence of negative voltage pulses during the second state Tb. In one embodiment, the sequence of negative voltage pulses has a pulse frequency in a range of 100 kHz to 500 kHz. The negative voltage pulses have a negative fourth voltage V4. In one embodiment, the fourth voltage V4 is in a range of −5 kV to −30 kV. The voltage pulses may have a rectangular, trapezoidal, or triangular waveform, or a combination of these waveforms.

In the examples illustrated in FIG. 9 to FIG. 11, the bias DC signal (DC1) has a fifth voltage V5 during the first state Ta and the third state Tc. The absolute value of the fifth voltage V5 is less than that of the fourth voltage V4. In one embodiment, the fifth voltage is 0 V. Note that, in one embodiment, the bias DC signal (DC1) may also have a sequence of negative voltage pulses during the first state Ta and the third state Tc. In this case, the absolute value of the negative pulse voltage is less than the absolute value of the negative voltage pulses during the second state Tb.

In the examples illustrated in FIG. 9 to FIG. 11, the relationship among the bias RF signal, the bias DC signal, and the upper DC signal during the first state Ta, the second state Tb, and the third state Tc is the same as the relationship among the source RF signal, the bias RF signal, and the upper DC signal described with reference to FIG. 5. Therefore, even in the examples illustrated in FIG. 9 to FIG. 11, the effects of improvement of the etching rate, suppression of shape abnormality and shape deterioration, and suppression of the abnormal discharge can be obtained.

EXAMPLES

Next, Examples of the present processing method will be described. Note however that this disclosure is not limited to Examples below.

Example 1

In Example 1, the present processing method using the plasma processing apparatus 1 was applied to etch a substrate similar in structure to the substrate W illustrated in FIG. 3. A silicon-containing film SF was a film stack of a silicon oxide film and a silicon nitride film. In process ST3, each signal had the repetition period T illustrated in FIG. 5.

Reference Example 1

In Reference Example 1, the substrate W was etched under the same conditions as Example 1 except that a constant negative voltage continued to be applied to the upper electrode in process ST3.

As a result, the etching rate of etching the silicon-containing film SF in Example 1 was improved compared to that in Reference Example 1, and the etching shape was also improved.

According to one exemplary embodiment of this disclosure, there can be provided a technique for suppressing an abnormal discharge in a plasma processing apparatus while improving an etching shape.

The embodiment of this disclosure further includes the following aspects.

Addendum 1

A plasma processing apparatus including:
a plasma processing chamber;
a substrate support disposed in the plasma processing chamber and including a lower electrode;
an upper electrode disposed above the substrate support;
a first RF signal generator coupled to the lower electrode and configured to generate a first RF signal, the first RF signal having a first power level during a first state in a repetition period, a second power level less than the first power level during a second state in the repetition period, and the second power level during a third state in the repetition period;
a second RF signal generator coupled to the lower electrode and configured to generate a second RF signal, the second RF signal having a third power level during the first state, a fourth power level greater than the third power level during the second state, and the third power level during the third state; and a DC signal generator coupled to the upper electrode and configured to generate a DC signal, the DC signal having a first voltage level during the first state and a second voltage level during the second state, an absolute value of the first voltage level being greater than an absolute value of the second voltage level.

Addendum 2

The plasma processing apparatus according to Addendum 1, wherein the first voltage level has a negative polarity.

Addendum 3

The plasma processing apparatus according to Addendum 1 or Addendum 2, wherein the DC signal has a third negative voltage level during the third state.

Addendum 4

The plasma processing apparatus according to any one of Addendum 1 to Addendum 3, wherein the second power level is zero power level.

Addendum 5

The plasma processing apparatus according to any one of Addendum 1 to Addendum 4, wherein the third power level is zero power level.

Addendum 6

The plasma processing apparatus according to any one of Addendum 1 to Addendum 5, wherein the second voltage level is zero voltage level.

Addendum 7

The plasma processing apparatus according to any one of Addendum 1 to Addendum 6, wherein the frequency of the first RF signal is greater than the frequency of the second RF signal.

Addendum 8

The plasma processing apparatus according to any one of Addendum 1 to Addendum 7, wherein the repetition period is a period in a range of 20 µs to 800 µs.

Addendum 9

The plasma processing apparatus according to any one of Addendum 1 to Addendum 8, wherein the first state occupies a period of 10% to 80% of the repetition period.

Addendum 10

The plasma processing apparatus according to any one of Addendum 1 to Addendum 9, wherein the second state occupies a period of 10% to 80% of the repetition period.

Addendum 11

The plasma processing apparatus according to any one of Addendum 1 to Addendum 10, wherein the third state occupies a period of 10% to 80% of the repetition period.

Addendum 12

The plasma processing apparatus according to any one of Addendum 1 to Addendum 11, wherein the first voltage level is in a range of −500 V to −2500 V.

Addendum 13

A plasma processing apparatus including:

a plasma processing chamber;

a substrate support disposed in the plasma processing chamber and including a lower electrode;

an upper electrode disposed above the substrate support;

an RF signal generator coupled to the lower electrode and configured to generate an RF signal, the RF signal having a first power level during a first state in a repetition period, a second power level less than the first power level during a second state in the repetition period, and the second power level during a third state in the repetition period;

a first DC signal generator coupled to the lower electrode and configured to generate a first DC signal, the first DC signal having a first voltage level during the first state, a sequence of voltage pulses having a second voltage level during the second state, and the first voltage level during the third state, an absolute value of the first voltage level being less than an absolute value of the second voltage level; and a second DC signal generator coupled to the upper electrode and configured to generate a second DC signal, the second DC signal having a third voltage level during the first state, and a fourth voltage level during the second state, an absolute value of the third voltage level being greater than an absolute value of the fourth voltage level.

Addendum 14

The plasma processing apparatus according to Addendum 13, wherein the second voltage level has a negative polarity.

Addendum 15

The plasma processing apparatus according to Addendum 13 or Addendum 14, wherein the sequence of voltage pulses has a pulse frequency in a range of 100 kHz to 500 kHz.

Addendum 16

The plasma processing apparatus according to any one of Addendum 13 to Addendum 15, wherein the first voltage level is zero voltage level.

Addendum 17

The plasma processing apparatus according to any one of Addendum 13 to Addendum 16, wherein the second voltage level is in a range of −5 kV to −30 kV.

Addendum 18

The plasma processing apparatus according to any one of Addendum 13 to Addendum 17, wherein the third voltage level has a negative polarity.

Addendum 19

The plasma processing apparatus according to any one of Addendum 13 to Addendum 18, wherein the second DC signal has the third voltage level during the third state.

Addendum 20

The plasma processing apparatus according to any one of Addendum 13 to Addendum 19, wherein the fourth voltage level is zero voltage level.

Addendum 21

A plasma processing method using a plasma processing apparatus, where the plasma processing apparatus includes: a plasma processing chamber; a substrate support disposed in the plasma processing chamber and including a lower electrode; an upper electrode disposed above the substrate support; a first RF signal generator; a second RF signal generator; and a DC signal generator, the plasma processing method including:

(a) a process of providing a substrate on the substrate support; (b) a process of supplying a process gas into the plasma processing chamber; and (c) a process of generating a plasma from the process gas, wherein in the process (c), a first RF signal is supplied from the first RF signal generator to the lower electrode, the first RF signal having a first power level during a first state in a repetition period, a second power level less than the first power level during a second state in the repetition period, and the second power level during a third state in the repetition period, a second RF signal is supplied from the second RF signal generator to the lower electrode, the second RF signal having a third power level during the first state, a fourth power level greater than the third power level during the second state, and the third power level during the third state, and a DC signal is supplied from the DC signal generator to the upper electrode, the DC signal having a first voltage level during the first state, a second voltage level during the second state, an absolute value of the first voltage level being greater than an absolute value of the second voltage level.

Addendum 22

A plasma processing method using a plasma processing apparatus, where the plasma processing apparatus includes: a plasma processing chamber; a substrate support disposed in the plasma processing chamber and including a lower electrode; an upper electrode disposed above the substrate support; an RF signal generator; a first DC signal generator; and a second DC signal generator, the plasma processing method including:

(a) a process of providing a substrate on the substrate support; (b) a process of supplying a process gas into the plasma processing chamber; and (c) a process of generating a plasma from the process gas, wherein in the process (c), an RF signal is supplied from the RF signal generator to the lower electrode, the RF signal having a first power level during a first state in a repetition period, a second power level less than the first power level during a second state in the repetition period, and the second power level during a third state in the repetition period, a first DC signal is supplied from the first DC signal generator to the lower electrode, the first DC signal having a first voltage level during the first state, a sequence of voltage pulses having a second voltage level during the second state, and the first voltage level during the third state, an absolute value of the first voltage level being less than an absolute value of the second voltage level, and a second DC signal is supplied from the second DC signal generator to the upper electrode, the second DC signal having a third voltage level during the first state, and a fourth voltage level during the second state, an absolute value of the third voltage level being greater than an absolute value of the fourth voltage level.

Each embodiment described above is described for illustrative purposes, and is not intended to limit the scope of this disclosure. Each embodiment described above can be modified in various ways without departing from the scope and spirit of this disclosure. For example, some components in a certain embodiment can be added to another embodiment. Further, some components in a certain embodiment can be replaced with corresponding components in another embodiment.

What is claimed is:

1. A plasma processing apparatus comprising:

a plasma processing chamber;

a substrate support disposed in the plasma processing chamber and including a lower electrode;

an upper electrode disposed above the substrate support;

a first RF signal generator coupled to the lower electrode and configured to generate a first RF signal, the first RF signal having a first power level during a first state in a repetition period, a second power level less than the first power level during a second state in the repetition period, and the second power level during a third state in the repetition period;

a second RF signal generator coupled to the lower electrode and configured to generate a second RF signal, the second RF signal having a third power level during the first state, a fourth power level greater than the third power level during the second state, and the third power level during the third state; and a DC signal generator coupled to the upper electrode and configured to generate a DC signal, the DC signal having a first voltage level during the first state and a second voltage level during the second state, an absolute value of the first voltage level being greater than an absolute value of the second voltage level.

2. The plasma processing apparatus according to claim 1, wherein the first voltage level has a negative polarity.

3. The plasma processing apparatus according to claim 2, wherein the DC signal has the first voltage level during the third state.

4. The plasma processing apparatus according to claim 3, wherein the second power level is zero power level.

5. The plasma processing apparatus according to claim 4, wherein the third power level is zero power level.

6. The plasma processing apparatus according to claim 5, wherein the second voltage level is zero voltage level.

7. The plasma processing apparatus according to claim 6, wherein a frequency of the first RF signal is greater than a frequency of the second RF signal.

8. The plasma processing apparatus according to claim 1, wherein the repetition period is in a range of 20 µs to 800 µs.

9. The plasma processing apparatus according to claim 1, wherein the first state is in a range of 10% to 80% of the repetition period.

10. The plasma processing apparatus according to claim 1, wherein the second state is in a range of 10% to 80% of the repetition period.

11. The plasma processing apparatus according to claim 1, wherein the third state is in a range of 10% to 80% of the repetition period.

12. The plasma processing apparatus according to claim 1, wherein the first voltage level is in a range of −500 V to −2500 V.

13. A plasma processing apparatus comprising:

a plasma processing chamber;

a substrate support disposed in the plasma processing chamber and including a lower electrode;

an upper electrode disposed above the substrate support;

an RF signal generator coupled to the lower electrode and configured to generate an RF signal, the RF signal having a first power level during a first state in a repetition period, a second power level less than the first power level during a second state in the repetition period, and the second power level during a third state in the repetition period;

a first DC signal generator coupled to the lower electrode and configured to generate a first DC signal, the first DC signal having a first voltage level during the first state, a sequence of voltage pulses having a second voltage level during the second state, and the first voltage level during the third state, an absolute value of the first voltage level being less than an absolute value of the second voltage level; and a second DC signal generator coupled to the upper electrode and configured to generate a second DC signal, the second DC signal having a third voltage level during the first state, and a fourth voltage level during the second state, an absolute value of the third voltage level being greater than an absolute value of the fourth voltage level.

14. The plasma processing apparatus according to claim 13, wherein the second voltage level has a negative polarity.

15. The plasma processing apparatus according to claim 14, wherein the sequence of voltage pulses has a pulse frequency in a range of 100 kHz to 500 kHz.

16. The plasma processing apparatus according to claim 15, wherein the first voltage level is zero voltage level.

17. The plasma processing apparatus according to claim 16, wherein the second voltage level is in a range of −5 kV to −30 kV.

18. The plasma processing apparatus according to claim 13, wherein the third voltage level has a negative polarity.

19. The plasma processing apparatus according to claim 18, wherein the second DC signal has the third voltage level during the third state.

20. The plasma processing apparatus according to claim 19, wherein the fourth voltage level is zero voltage level.

* * * * *